(12) United States Patent
Helwig

(10) Patent No.: US 7,061,782 B2
(45) Date of Patent: Jun. 13, 2006

(54) CONTENT ADDRESSABLE MEMORY (CAM) FOR DATA LOOKUPS IN A DATA PROCESSING SYSTEM

(76) Inventor: Klaus Helwig, Hungerbergweg 13, D-71093, Weil i.Schoenbuch (DE)

( * ) Notice: Subject to any disclaimer, the term of this patent is extended or adjusted under 35 U.S.C. 154(b) by 193 days.

(21) Appl. No.: 09/962,052

(22) Filed: Sep. 24, 2001

(65) Prior Publication Data
US 2002/0036912 A1 Mar. 28, 2002

(30) Foreign Application Priority Data
Sep. 23, 2000 (EP) .......................... 00120817

(51) Int. Cl.
*G11C 15/00* (2006.01)

(52) U.S. Cl. .................... 365/49; 365/189.07
(58) Field of Classification Search ............ 365/49, 365/189.07, 203
See application file for complete search history.

(56) References Cited

U.S. PATENT DOCUMENTS 5,351,208 A * 9/1994 Jiang ......................... 365/49
5,453,948 A * 9/1995 Yoneda ....................... 365/49
6,195,278 B1 * 2/2001 Calin et al. .................. 365/49

* cited by examiner

*Primary Examiner*—Son Mai

(57) ABSTRACT

Power consumption is reduced in a content addressable memory of a data processing system or a data processor. The content addressable memory includes at least a first single bit storage (101; 301), a word line (WL), at least one bit write line (BLWT, BLWC) and a hit/miss line (H/M), and at least a first single bit compare circuit (201; 320), the first single bit storage including at least a first output (A; A0) and the first single bit compare circuit including at least a first compare bit input (BLCT; CB 0) and two field effect transistors (113, 114; 312, 313). In order to reduce the power consumption, the first output (A; A0) of the single bit storage (101; 301) is applied to the gate of only one, a first field effect transistor (114; 312) of the two field effect transistors (113, 114; 312, 313). For an additional reduction of the power consumption, two single bit storages (101, 301) are connected to a shared compare circuit (319). In case of a mismatch, only one out of four compare nodes (C0, C1, C2, C3) of the shared compare circuit is switched high, i.e. changes its potential.

10 Claims, 4 Drawing Sheets

CONTENT ADDRESSABLE MEMORY (CAM) FOR DATA LOOKUPS IN A DATA PROCESSING SYSTEM

BACKGROUND OF THE INVENTION

1. Field of the Invention

The present invention is generally related to a data memory for data lookups in a clocked data processing system comprising a data processor.

More particularly, the present invention relates to a content addressable memory (CAM) or associative content addressable memory, in such a system.

2. Related Art

An associative memory or content addressable memory (CAM) is a memory comprising a plurality of CAM circuits, each comprising a memory circuit and a compare circuit. The CAM is accessed by data content, rather than by the address or location of data.

A CAM circuit of a known content addressable memory (CAM) will be described in connection with FIG. 1.

SUMMARY OF THE INVENTION

It is an object of the present invention to provide a content addressable memory (CAM), which is more efficient.

It is a further object of the present invention to provide a content addressable memory (CAM), which comprises an enhanced layout.

It is another object of the present invention to provide a content addressable memory (CAM) with a layout for increased memory capacity.

It is an object of the present invention to provide a content addressable memory (CAM) with a layout for reduced power consumption per memory bit.

It is another object of the present invention to provide a content addressable memory (CAM), which allows to perform write and compare cycles at a high reliability.

It is yet another object of the present invention to provide a content addressable memory that is able to work at high clock speeds of a data processing system and/or within a data processor.

BRIEF DESCRIPTION OF THE DRAWINGS

For a more complete understanding of the present invention, and the advantages thereof, reference is now made to the following descriptions taken in conjunction with the accompanying drawings in which the same reference signs have been used for the same parts or parts with the same or a similar effect, and in which.

DESCRIPTION OF THE PREFERRED EMBODIMENTS

Figure 1:
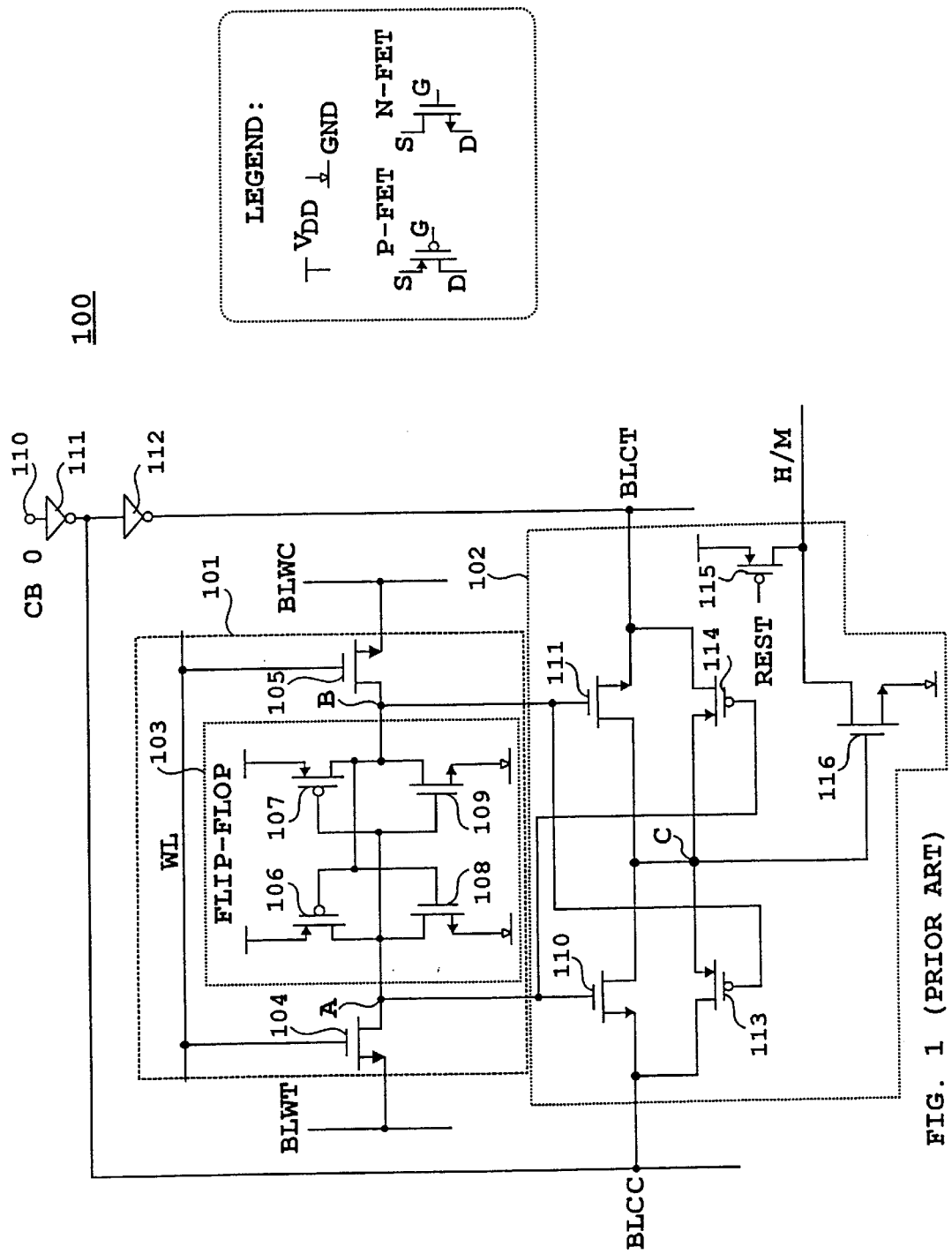
FIG. 1 shows a schematical illustration of a single bit CAM circuit of a conventional content addressable memory (CAM) comprising a plurality of such CAM circuits and a legend.

FIG. 1 shows a schematical illustration of a single bit CAM circuit 100 of a conventional content addressable memory (not shown) comprising a plurality of such CAM circuits and depicts a legend explaining details shown in the figures.

The conventional single bit CAM circuit 100 comprises a single bit storage 101 and a single bit compare circuit 102.

The single bit storage 101 comprises a known flip-flop 103 for storing a single bit (0-bit or 1-bit; low or high-level signal). The single bit is written into the flip-flop 103 by addressing the flip-flop 103 via a word line WL and applying a low-level signal or a high-level signal to a bit line write true BLWT and the complement of the applied signal to the bit line write complement BLWC. The flip-flop comprises a P-FET 106, a P-FET 107, as well as an N-FET 108 and an N-FET 109. The word line WL switches an N-FET 104 and an N-FET 105 and one bit is clocked and stored in the flip-flop 103. After storing a 1-bit in flip-flop 103 node A comprises a high-level signal and node B comprises a low-level signal, while after storing a 0-bit, node A comprises a low-level signal and node B comprises a high-level signal. Since the single bit storage 101 as well as the flip-flop 103 is well known to those skilled in the art its design and operation will not be explained here in more detail.

The known single bit compare circuit 102 comprises an N-FET 110, an N-FET 111, a P-FET 113, a P-FET 114, a P-FET 115, and an N-FET 116, which are connected with node A, node B, bit line compare true BLCT, bit line compare complement BLCC, restore line REST and hit/miss line H/M as shown in FIG. 1.

For comparing, whether or not a compare bit CD 0 (0-bit or 1-bit; low or high-level signal) matches with the 0-bit or 1-bit stored in the single bit storage 101, the compare bit CB 0 is applied to a terminal 110, inverted by an inverter 111 and applied to bit line compare complement BLCC, while the output signal of inverter 111 is applied to the input of an inverter 112 and the inverted signal of the inverter 112 is applied to the bit line compare true BLCT.

If the compare bit CB 0 matches with the bit stored in the single bit storage 101, node C changes its potential from a low-level (ground) to a high-level ($V_{DD}$), and the N-FET 116 pulls hit/miss line H/M from the high-level potential ($V_{DD}$) to the low-level potential (ground).

In case that the compare bit CB 0 does not match with the bit stored in the single bit storage 101, node C remains its low-level potential (ground) and the hit/miss line H/M remains its high-level potential ($V_{DD}$).

Before comparing the bit stored in the single bit storage 101 with another compare bit CB 0 or before storing another bit to be compared in flip-flop 103, a restore signal REST with the high-level potential ($V_{DD}$) is applied to the P-FET 115 pulling of hit/miss line H/M to the high-level potential and the node C to ground, whereafter the node C regains its low-level potential (ground) and the hit/miss line H/M regains its high-level potential as initially, before applying a compare bit via data signals on bit line compare true BLCT and bit line compare complement BLCC.

As shown in FIG. 1, each of the nodes A and B drives the gate of a P-FET and of an N-FET. Accordingly, each of the nodes A and B is loaded with the electric capacity of two gates, which prolongates the time necessary for storing a bit in the flip-flop 103.

Figure 2:
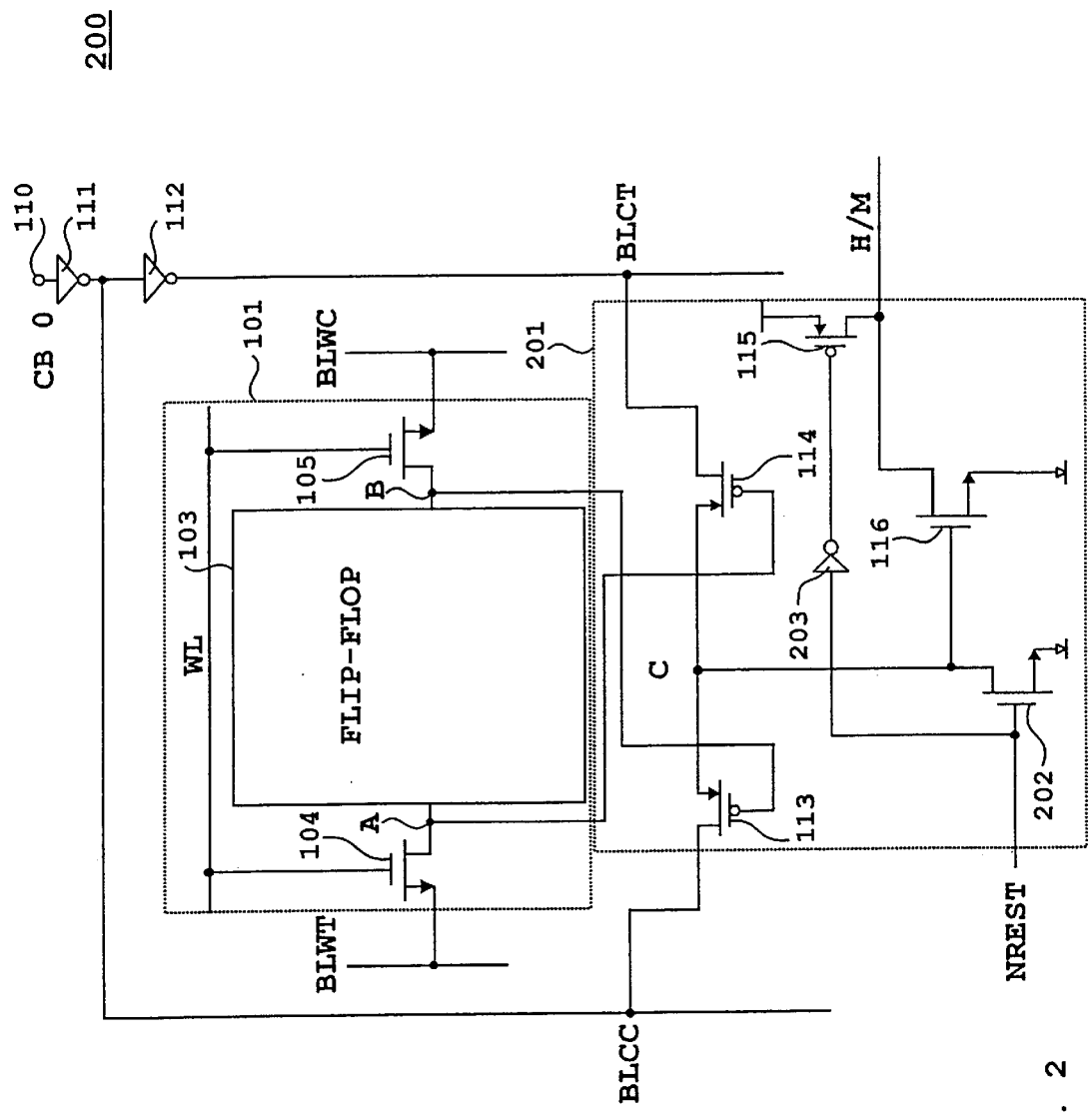
FIG. 2 depicts a schematical illustration of a single bit CAM circuit of a content addressable memory (CAM) according to the invention comprising a plurality of such CAM circuits.

FIG. 2 depicts a schematical illustration of a single bit CAM circuit 200 of a content addressable memory (not shown) according to the invention, which comprises a plurality of the single bit CAM circuit 200 (not shown). The single bit CAM circuit 200 of the invention comprises the same single bit storage 101 and flip-flop 103 shown in FIG. 1, but is distinguished from the known single bit CAM circuit 100, shown in FIG. 1, by a single bit compare circuit 201 according to the invention.

The single bit compare circuit 201 comprises the P-FET 113, the P-FET 114, the P-FET 115 and the N-FET 116, as the known single bit compare circuit 100, but does not comprise the N-FET 110 and the N-FET 111. Instead the single bit compare circuit 201 comprises an N-FET 202 and an inverter 203.

As in single bit compare circuit 100, the node A is connected with the gate of P-FET 114 and the node B is connected with the gate of P-FET 113. Accordingly, as shown in FIG. 2, node A is connected with only one gate of a FET as well as node B is connected with only one gate of a FET.

In the single bit compare circuit 200, shown in FIG. 2, the drain of the P-FET 113 is connected with the bit line compare complement BLCC, the drain of the P-FET 114 is connected with bit line compare true BLCT, and the node C is connected with the gate of N-FET 116, as in the single bit compare circuit 100, shown in FIG. 1. As shown in FIG. 2, the source of the P-FET 115 is connected with the high-level potential and the drain of the P-FET 115 is connected with the hit/miss line H/M, the hit/miss line H/M is connected with the source of the N-FET 116, the drain of the N-FET 116 is connected with the low-level potential (ground) and the gate of the N-FET 116 is connected with node C, as in the single bit compare circuit 100, shown in FIG. 1. In contrast to the single bit compare circuit 100, shown in FIG. 1, in the single bit compare circuit 200, shown in FIG. 2, the source of the N-FET 202 is connected with the node C, the drain of the N-FET 202 is connected with the low-level potential (ground), the gate of the N-FET 202 is connected with an input for a low-level potential (ground) reset signal NREST and the input of the inverter 203 and the output of the inverter 203 is connected with the gate of the P-FET 115. In the following the function of the single bit CAM circuit 200, shown in FIG. 2, will be described in detail. As in the single bit CAM circuit 100 of FIG. 1, for comparing, whether or not a compare bit CB 0 (0-bit or 1-bit; low or high-level signal) matches with the 0-bit or 1-bit stored in the single bit storage 101 of FIG. 2, the compare bit CB 0 is applied to the terminal 110, shown in FIG. 2. The compare bit CB 0 is inverted by the inverter 111 and applied to the bit line compare complement BLCC, while the output signal of the inverter 111 is applied to the input of the inverter 112 and the inverted signal of the inverter 112 is applied to the bit line compare true BLCT.

In contrast to the single bit CAM circuit 100, if the compare bit CB 0 matches with the bit stored in the single bit storage 101, the electric potential of the node C in FIG. 2 remains at the low-level (ground) potential as well as the hit/miss line H/M in FIG. 2 remains at the high-level potential ($V_{DD}$).

In contrast to the single bit CAM circuit 100, in case that the compare bit CB 0 does not match with the bit stored in the single bit storage 101 of FIG. 2, the node C in FIG. 2 changes from the low-level potential (ground) to the high-level potential ($V_{DD}$) as well as the hit/miss line H/M changes from the high-level potential ($V_{DD}$) to the low-level potential (ground).

Before comparing the bit stored in the single bit storage 101 of FIG. 2 with another compare bit CB 0 or before storing another bit to be compared in flip-flop 103 of FIG. 2, a restore signal NREST comprising the high-level potential ($V_{DD}$) is applied to the gate of N-FET 202 pulling the potential of the node C in FIG. 2 to ground, whereafter the node C comprises a low-level potential (ground). In addition, the inverted signal of NREST is applied to the gate of the P-FET 115 pulling the hit/miss line H/M to the high-level potential ($V_{DD}$).

In contrast to the single bit CAM circuit 100 each of the nodes A and B drives the gate of only one FET, as shown in FIG. 2. Accordingly, each of the nodes A and B is loaded only with the electric capacity of a single gate in contrast to two gates as known. This allows to significantly reduce the time necessary for reliably storing a bit in the flip-flop 103 of FIG. 2 as well as to significantly reduce the power consumption of the single bit CAM circuit 200 with regard to the known solution of FIG. 1. Since a CAM circuit according to the invention (not shown) comprises a plurality of single bit CAM circuits 200 this is of particular importance.

Figure 3:
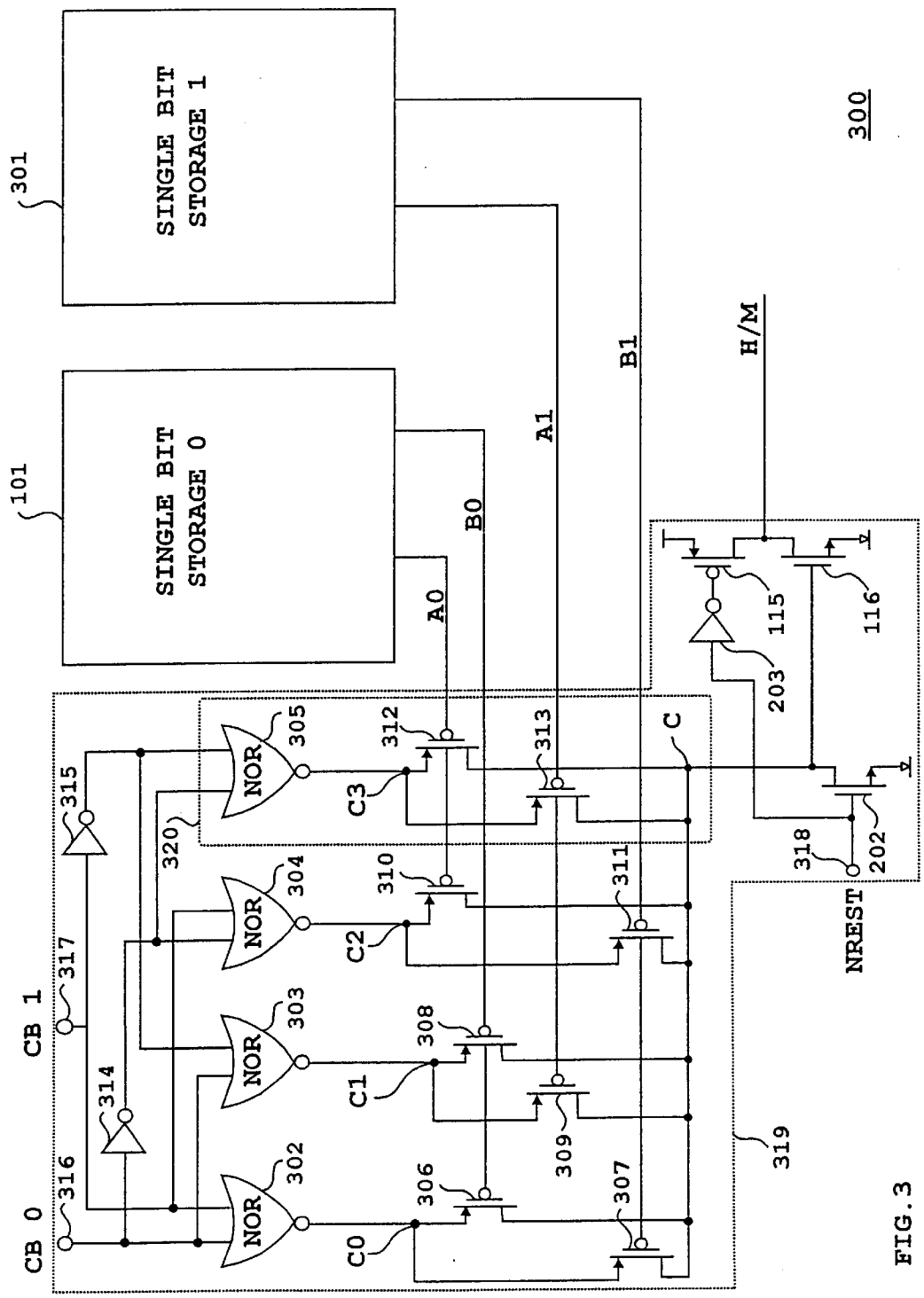
FIG. 3 is a schematical illustration of a boarding of two single bit storages with a two-bit compare circuit according to the invention of a content addressable memory (CAM) comprising a plurality of such boardings.

FIG. 3 is a schematical illustration of a boarding of two single bit storages 101 and 301 with a two-bit compare circuit according to the invention of a content addressable memory (not shown), which comprises a plurality of such boardings according to the invention.

The boarding shown in FIG. 3 comprises a first single bit storage 101, a second single bit storage 301, four NOR gates 302, 303, 304, and 305, nine P-FETs 306, 307, 308, 309, 310, 311, 312, 313 and 115, three inverters 203, 314 and 315 and two N-FETs 116 and 202, which are connected with each other and a terminal 316, a terminal 317, a node A0, a node B0, a node A1, a node B1, a node C0, a node C1, a node C2, a node C3, a node C, a terminal 318, and a hit/miss line H/M as shown in FIG. 3.

The single bit storage 101 and the single bit storage 301 are identical with the single bit storage 101 shown in FIGS. 1 and 2. Accordingly, each of them comprises a different bit line write true BLWT, a different bit line write complement BLWC but both comprise a common word line WL (not shown) for independently storing a single 0-bit or 1-bit in each of them. In addition, such as single bit storage 101 in FIG. 1 comprises the nodes A and B, the single bit storage 101 shown in FIG. 3 comprises the nodes A0 and B0 and the single bit storage 301 comprises the nodes A1 and B1.

Each of the two P-FETs 306 and 307, the P-FETs 308 and 309, the P-FETs 310 and 311 and the P-FETs 312 and 313 are parallel connected, i.e. the sources are connected with each other as well as the drains are connected with each other. The drains of each of these P-FETs are connected with each other forming the node C. The connection of the sources of the P-FETs 306 and 307 forms the node C0, the connection of the sources of the P-FETs 308 and 309 forms the node C1, the connection of the sources of the P-FETs 310 and 311 forms the node C2, and the connection of the sources of the P-FETs 312 and 313 forms the node C3. The node C0 is connected with the output of the NOR gate 302, the node C11 is connected with the output of the NOR gate 303, the node C2 is connected with the output of the NOR gate 304 and the node C3 is connected with the output of the NOR gate 305. The first input of the NOR gate 302 is connected with the terminal 316 for applying a first compare bit CB 0 (0-bit or 1-bit) to the boarding 300, the second input of the NOR gate 302 is connected with the terminal 317 for applying a second compare bit CB 1 (0-bit or 1-bit) to the boarding 300. The first input of the NOR gate 303 is connected with the first input of the NOR gate 302 and the terminal 317 is connected with the second input of the NOR gate 303 via the inverter 315. The terminal 316 is connected with the first input of the NOR gate 304 via the inverter 314 and the second input of the NOR gate 304 is connected with the second input of the NOR gate 302. The first input of the NOR gate 305 is connected with the first input of the NOR gate 304 and the second input of the NOR gate 305 is connected with the second input of the NOR gate 303.

The node A0 of the single bit storage 101, i.e. the single bit storage 0 in FIG. 3, is connected with the gate of the P-FET 310 and the gate of the P-FET 312, the node B0 of the single bit storage 101 is connected with the gate of the P-FET 306 and the gate of P-FET 308, the node A1 of the single bit storage 301, i.e. the single bit storage 1 in FIG. 3, is connected with the gate of the P-FET 309 and the gate of the P-FET 313. The node B1 of the single bit storage 301 is connected with the gate of the P-FET 307 and the gate of the P-FET 311.

As in FIG. 2, the node C is connected with the source of the N-FET 202 and the gate of the N-FET 116. The terminal 318 is connected with the gate of the N-FET 202 and the input of the inverter 203, the drain of the N-FET 202 is connected with the low-level potential (ground), the drain of the N-FET 116 is connected with the low-level potential (ground), the source of the P-FET 115 is connected with the high-level potential ($V_{DD}$), the gate of the P-FET 115 is connected with the output of the inverter 203 and the drain of the P-FET 115 is connected with the source of the N-FET 116 as well as with the hit/miss line H/M.

In the following the function of the boarding 300 will be described in detail. It is assumed that a 1-bit is stored in the single bit storage 101 as well as a 1-bit is stored in the single bit storage 301 in similar manner as described with regard to the single bit storage 101 of FIG. 1. Accordingly, the node A0 comprises a high-level potential ($V_{DD}$), the node B0 comprises a low-level potential (ground), the node A1 comprises a high-level potential ($V_{DD}$) and the node BD comprises a low-level potential (ground).

Furthermore, in a first non-limiting example a 1-bit (CB 0) is applied to the terminal 316 and a 1-bit (CB 1) is applied to the terminal 317. In other words, the bits to be compared and stored in the single bit storage 101 and the single bit storage 301 match with the compare bits CB 0 and CB 1. The node C0, the node C1, and the node C2 comprise the low-level potential, while the node C3 comprises a high-level potential as will be easily derived by one skilled in the art. As the high-level potential is applied to the gate of the P-FET 312 and to the source of the P-FET 312 (node C3) as well as to the gate of the P-FET 313 and to the source of the P-FET 313 (node C3), the node C as well as the gate of the N-FET 116 remains on its low-level potential and the hit/miss line H/M remains on its high-level potential ($V_{DD}$), in case of a match.

Accordingly, none of the nodes A0, B0, A1 and B1 is loaded with driving the P-FETs 306 to 313.

Before applying a 0-bit (CB 0) to the terminal 316 and a 1-bit (CB 1) to the terminal 317 in a second non-limiting example, the low-level potential (ground) is applied to the terminal 318 (NREST) and the hit/miss line H/M remains on the high-level potential ($V_{DD}$). When the 0-bit is applied to the terminal 316 and the 1-bit is applied to the terminal 317 and 318, the nodes C0, C2 and C3 comprise the low-level potential (ground), while the node C1 comprises the high-level potential($V_{DD}$). Since the low-level potential (ground) is applied to the gate of the P-FET 308 and the high-level potential($V_{DD}$) is applied to the source of the P-FET 308 (node C1) the P-FET 308 opens and pulls the node C to the high-level potential ($V_{DD}$). Since the node C is connected with the gate of the N-FET 116, the N-FET 116 pulls the hit/miss line H/M to the low-level potential (ground) indicating that the compare bits CB 0 (0-bit) and CB 1 (1-bit) do not match with the bits to be compared and stored in the single bit storages 101 (1-bit) and 301 (1-bit).

Before applying another two bits to the terminals 316 and 317 to be compared with the bits stored in the single bit storages 101 and 301, the low-level potential (ground) is applied to the terminal 318 (NREST), which opens the N-FET 202 and pulls the node C as well as the gate of the N-FET 116 back to the low-level potential (ground). In addition, the restore signal (NREST) is inverted by the inverter 203 and the inverted signal (the high-level potential) is applied to the gate of the P-FET 115. The P-FET 115 opens and pulls the hit/miss line H/M back to the high-level potential.

Accordingly, only one node of the nodes A0, B0, A1 and B1 is loaded with driving the P-FETs 306 to 313.

In contrast, when using the known solution, shown in FIG. 1, for comparing two stored bits with two compare bits, eight FETs, when using the solution according to the invention, shown in FIG. 2, four FETs and when using the solution according to the invention, shown in FIG. 3, only one FET needs to be driven by a set of two single bit storages.

According to the inventive solutions, shown in FIGS. 2 and 3, the significant reduction of FETs, which have to be switched, in order to perform a comparison of one or more compare bits with stored bits in a content addressable memory (CAM), allows to significantly reduce the power consumption, the noise generated by the switching of the FETs and enables to use longer hit/miss lines. Thereby, a content addressable memory may be built, which comprises a significantly increased storage capacity, i.e. a "broader" CAM, which nevertheless comprises a lower power consumption per bit and may be used in a data processing system and/or in a data processor, such as a microprocessor, at a higher clock speed with regard to the known solution. The reduction of noise increases the reliability of a content addressable memory (CAM) according to the invention and reduces the negative impact of noise on other electronic components with regard to the known solution.

Summarized, for an additional reduction of the power consumption per bit to be compared with regard to the single bit CAM circuit 200, as shown in FIG. 2, two single bit storages, i.e. particularly two single bit storage cells, are connected to a shared compare circuit, i.e. particularly the two-bit compare circuit 319. In case of a mismatch only one out of the four nodes C0, C1, C2 and C3 is switched high, i.e. changes its potential.

The change of the potential of the node C of the boarding 300, as shown in FIG. 3, is slightly slower than the change of the potential of the node C of the single bit CAM circuit 200, as shown in FIG. 2. However, this is more than compensated, since the hit/miss line H/M of the boarding 300 is loaded only with the half of the number of N-FETs, i.e. two N-FETs 1i 6 and 202 instead of two times these N-FETs with regard to two single bit CAM circuits 200. This results in a change of the potential of the hit/miss line HIM of the boarding 300, which is significantly faster than the change of the potential of the hit/miss line H/M of the single bit CAM circuit 200.

In addition, it should be noted that the combination of the inverter 203 and the P-FET 115 is only necessary once per hit/miss line H/M, instead of two combinations of the inverter 203 and the P-FET 115 with regard to two single bit CAM circuits 200.

It will be understood by those skilled in the art that the boarding of two single bit storages, as shown in FIG. 3, can be easily extended to a boarding, which comprises more than two single bit storages and more than a two-bit compare circuit, which also comprises the mentioned advantages.

Figure 4:
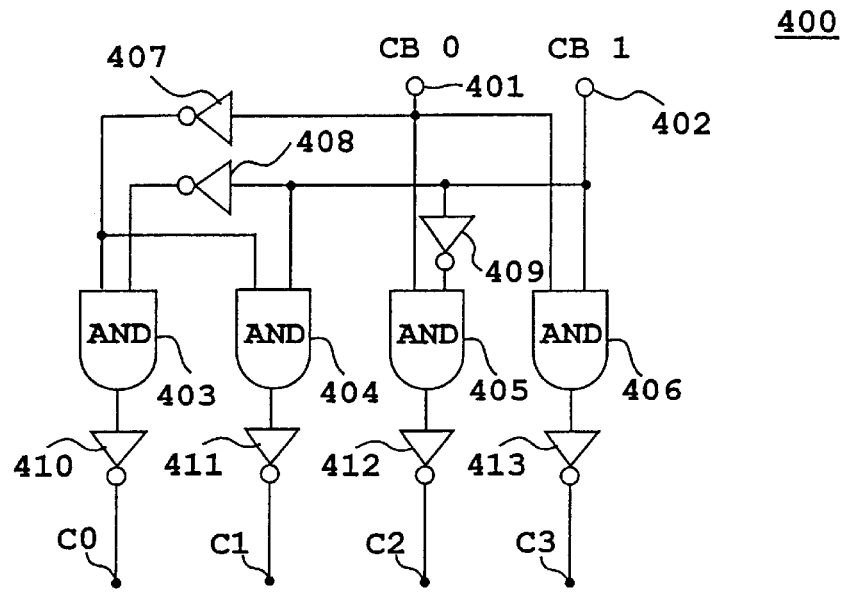
FIG. 4 shows a schematical illustration of another embodiment of a first component of the two-bit compare circuit shown in FIG. 3.

FIG. 4 shows a schematical illustration of another embodiment of the first component of the two-bit compare circuit 319 shown in FIG. 3. The first component of the two-bit compare circuit 319, as shown in FIG. 3, comprises the two input terminals 316 and 317, the inverters 314 and 315, the NOR gates 302 to 305 and the output nodes C0 to C3, which are connected with each other as shown in FIG. 3. The first component 400 of the bit compare circuit 319, as shown in FIG. 4, which may be used to substitute the first component shown in FIG. 3, comprises two input terminals 401 and 402 for applying the compare bits CB 0 and CB 1 to the boarding 300. In addition, the first component 400 comprises four AND gates 403, 404, 405 and 406 and seven inverters 407, 408, 409, 410, 411, 412, and 413, which are connected with each other as shown in FIG. 4. Each set of AND gate and inverter 403 and 410, 404 and 411, 405 and 412, and 406 and 413 forms a NAND gate. The outputs of the NAND gates are the nodes C0, C1, C2 and C3.

Figure 5:
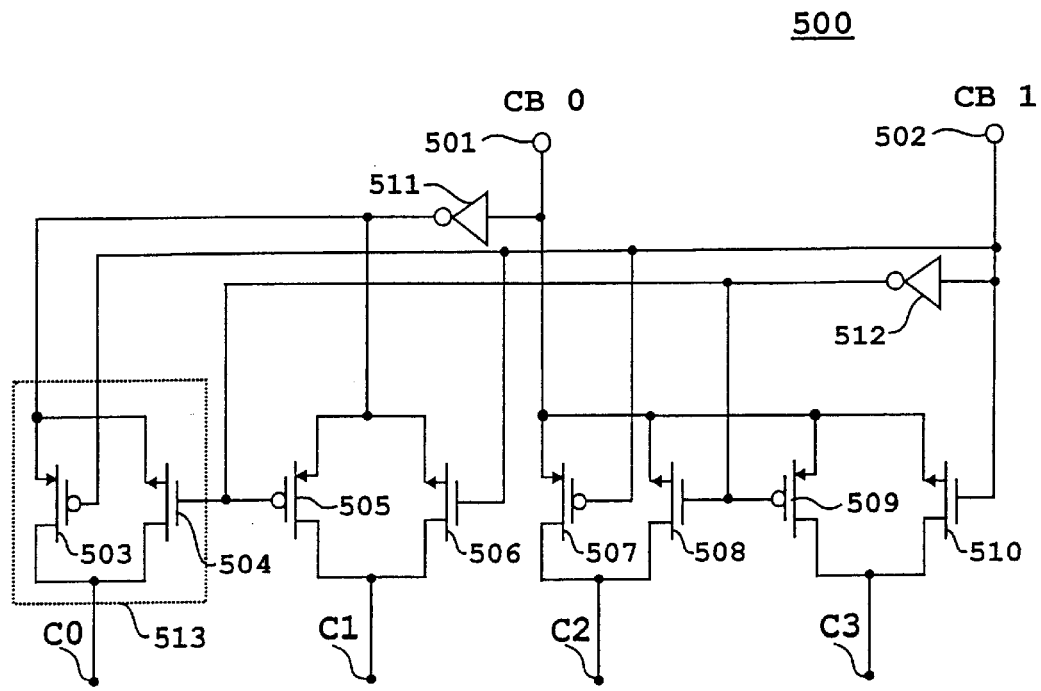
FIG. 5 depicts a schematical illustration of a further embodiment of the first component of the two-bit compare circuit shown in FIG. 3.

FIG. 5 depicts a schematical illustration of a further embodiment 500 of the first component of the two-bit compare circuit 319 shown in FIG. 3. The first component 500, which may substitute the first component of the two-bit compare circuit 319 shown in FIG. 3, comprises a first transfer gate 513 formed by a P-FET 503 and an N-FET 504, a second transfer gate formed by a P-FET 505 and an N-FET 506, a third transfer gate formed by a P-FET 507 and an N-FET 508 and a fourth transfer gate formed by a P-FET 509 and an N-FET 510. The drain of the P-FET 503 is connected with the source of the N-FET 504 and the node C0, the drain of the P-FET 505 is connected with the source of the N-FET 506 and the node C1, the drain of the P-FET 507 is connected with the source of the N-FET 508 and the node C2, and the drain of the P-FET 509 is connected with the source of the N-FET 510 and the node C3. In addition, the first component 500 of the two-bit compare circuit 319, comprises a terminal 501 and a terminal 502 for applying the compare bits CB 0 and CB 1 to the two-bit compare circuit 319 as well as two inverters 511 and 512, which are connected with the transfer gates as shown in FIG. 5.

It should be noted that the FIGS. 1 to 5 are schematical illustrations, i.e. in practice the integrated CAM circuits according to the invention comprise further electronic components, which may be easily adapted to the solutions of the invention by those skilled in the art.

LEGEND $V_{DD}$ supply voltage
GND ground
P-FET P field effect transistor
N-FET N field effect transistor
S source
G gate
D drain

REFERENCE LIST 100 single bit CAM circuit
101 single bit storage
102 single bit compare circuit
103 flip-flop
BLWT bit line write true
BLWC bit line write complement
A node
B node
C node
BLCT bit line compare true
BLCC bit line compare complement
REST restore line
H/M hit/miss line
104 N-FET
105 N-FET
106 P-FET
107 P-FET
108 N-FET
109 N-FET
110 terminal
111 inverter
112 inverter
113 P-FET
114 P-FET
115 P-FET
116 N-FET
200 single bit CAM circuit
201 single bit compare circuit
202 N-FET
203 inverter
NREST low-level potential (ground) reset signal
300 boarding of two single bit storages with a two-bit compare circuit
301 single bit storage 1
302 NOR
303 NOR
304 NOR
305 NOR
306 P-FET
307 P-FET
308 P-FET
309 P-FET
310 P-FET
311 P-FET
312 P-FET
313 P-FET
314 inverter
315 inverter
316 terminal
317 terminal
318 terminal
319 two-bit compare circuit
320 single bit compare circuit C node
C0 node
C1 node
C2 node
C3 node
A0 node
B0 node
A1 node
B0 node
400 first component of the two-bit compare circuit
401 terminal
402 terminal
403 AND gate
404 AND gate
405 AND gate
406 AND gate
500 first component of the two-bit compare circuit
501 terminal
502 terminal
503 P-FET
504 N-FET
505 P-FET
506 N-FET
507 P-FET
508 N-FET
509 P-FET
511 inverter
512 inverter
513 transfer gate

What is claimed is:

1. A content addressable memory comprising at least a first single bit storage, a word line, at least one bit write line and a hit/miss line, and at least a first single bit compare circuit, said first single bit storage comprises at least a first output and said first single bit compare circuit comprises at least a first compare bit input and two field effect transistors, characterized in that
said first output of said single bit storage is applied to the gate of only one, a first field effect transistor of said two field effect transistors,
a second output of said single bit storage is applied to the gate of only one, a second field effect transistor of said two field effect transistors,
the source of said first field effect transistor is connected with the source of said second field effect transistor, and
characterized by a third field effect transistor, whereby the sources of said first and said second field effect transistors are connected with the source of said third field effect transistor and a restore signal is applied to the gate of said third field effect transistor.

2. The content addressable memory of claim 1, characterized by a fourth field effect transistor, whereby the drain of said fourth field effect transistor is connected with said hit/miss line and an inverted signal of said restore signal is applied to the gate of said fourth field effect transistor.

3. A content addressable memory comprising at least a first single bit storage, a word line, at least one bit write line and a hit/miss line, and at least a first single bit compare circuit, said first single bit storage comprises at least a first output and said first single bit compare circuit comprises at least a first compare bit input and two field effect transistors, characterized in that
said first output of said single bit storage is applied to the gate of only one, a first field effect transistor of said two field effect transistors, and
characterized by
a second single bit storage comprising at least a first output, whereby
said first output of said second single bit storage is applied to the gate of a fifth field effect transistor; and
said source of said first field effect transistor is connected with the source of said fifth field effect transistor.

4. The content addressable memory of claim 3, characterized in that the drains of said first and said fifth field effect transistor are connected with the drain of a sixth field effect transistor.

5. The content addressable memory of claim 3, characterized in that said first and said fifth field effect transistors are P-FETs.

6. The content addressable memory of claim 4, characterized in that said third or said sixth field effect transistor is an N-FET.

7. The content addressable memory of claim 3, characterized by at least a first logical gate comprising a first input, a second input and an output, and the output of said first logical gate is connected with the sources of said first and said fifth field effect transistor, whereby said first logical gate and said first and said fifth field effect transistor form said first single bit compare circuit.

8. The content addressable memory of claim 7, characterized by four single bit compare circuits, each single bit compare circuit comprising two field effect transistors and each of the outputs of said two single bit storages is connected with the gates of two field effect transistors of different single bit compare circuits.

9. The content addressable memory of claim 7, characterized in that the inverted signal of a first compare bit is applied to the first input of said first logical gate and the inverted signal of a second compare bit is applied to the second input of said logical gate.

10. The content addressable memory of claim 7, characterized in that at least said first logical gate is a NOR, a NAND or a transfer gate.

* * * * *